(12) United States Patent
Beiley et al.

(10) Patent No.: US 6,362,695 B1
(45) Date of Patent: Mar. 26, 2002

(54) METHOD AND APPARATUS TO PRODUCE A RANDOM BIT SEQUENCE

(75) Inventors: Mark A. Beiley; James E. Breisch, both of Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/468,478

(22) Filed: Dec. 21, 1999

(51) Int. Cl.⁷ ............................................... H03B 29/00
(52) U.S. Cl. ........................................................ 331/78
(58) Field of Search .............................................. 331/78

(56) References Cited

U.S. PATENT DOCUMENTS 4,580,109 A * 4/1986 Lockwood ............ 331/117 FE
5,961,577 A   10/1999 Soenen et al.

* cited by examiner

*Primary Examiner*—David Mis
(74) *Attorney, Agent, or Firm*—Blakely, Sokoloff, Taylor & Zafman LLP

(57) ABSTRACT

A circuit includes a first oscillator having transistors to produce a first signal with random variations resulting from device channel resistance of the transistors.

14 Claims, 3 Drawing Sheets

METHOD AND APPARATUS TO PRODUCE A RANDOM BIT SEQUENCE

BACKGROUND

1. Field

The invention relates to circuits which generate random bit sequences.

2. Background Information

Random bit sequences are sequences of binary signals lacking discernible patterns or repetition over time. Random bit sequences are useful in encryption operations and other electrical operations which employ unpredictable signal sequences. A "true" random sequence may be derived from thermal noise characteristics of electronic components. FIG. 5 shows a prior art circuit 500 which employs thermal noise characteristics of electrical components to generate a random bit sequence. A resistor 502 and capacitor 504 pair provides a voltage signal to the positive input terminal of a differential amplifier 510. Another resistor 506 and capacitor 508 pair provide a voltage signal to the negative terminal of the differential amplifier 510. The differential voltage provided to the terminals of the differential amplifier 510 will vary randomly due to the thermal noise of the resistors. The voltage signal output by the differential amplifier 510 amplifies these random variations. For example, differential amplifier 510 may amplify the voltage between the positive and negative input terminals by a factor of 200 or more. The amplified differential voltage is input to a voltage controlled oscillator 512 (VCO). VCO 512 provides a periodic signal with a frequency that varies according to the voltage input from the differential amplifier 510. The frequency of the VCO signal thus varies according to the random variations in the voltage signal provided to the VCO 512. Circuit 514 converts the VCO signal into a ground-referenced signal which is supplied to the clock terminal of a D-style flip-flop 518. Of course, a differential sampler circuit could be used in place of the conventional flip-flop, in which case the VCO signal could be applied to the sampler without converting to a ground-based signal with circuit 514. Flip-flop 518 (or other sampler circuit) may be configured to propagate the signal at its D input terminal (the D signal) to its Q output terminal upon receiving an edge of VCO signal (this is often referred to as "latching" the D signal). The random variations in the frequency of VCO signal result in random variations in the timing of the edges of VCO signal. Therefore, flip-flop 518 latches the D signal at randomly-varying points in time. High frequency oscillator 516 (HFO) provides the D signal to the flip-flop 518. D signal produced by HFO 516 transitions from logical low to logical high rapidly and periodically; flip-flop 518 will latch the D signal at logical low or at logical high randomly, according to the random variations in the timing of VCO signal edges. The latched D signal is output on terminal Q as random bit sequence 520.

A disadvantage of circuit 500 is that amplifier 510 comprises numerous analog components. For example, the resistors and capacitors and the differential amplifier 510 may be implemented as analog circuits. Analog component designs tend to not scale well to higher frequency and lower voltage processes. Furthermore, the internal analog components of amplifier 510 may accumulate signals over time (such as so-called "1/f noise") which result in deviations in the amplifier's desired performance. A further disadvantage of circuit 500 is that in order to maintain the randomness of the variation in the VCO output signal, differential amplifier 510 must be prevented from "railing". Railing occurs when the input signals to the amplifier or the deviations resulting from "1/f noise" cause the amplifier output signal to reach a maximum predetermined low or high voltage. In other words, amplifier output signal may level off at a low or high DC voltage level. Once this happens, the VCO output signal frequency becomes more or less constant. The VCO output signal no longer reflects random variations in frequency. Consequently, the bit stream 512 provided at output terminal Q of flip-flop 518 will lose its random characteristics. Preventing the output of differential amplifier 520 from railing involves complex equalization circuitry. Such circuitry results in increased circuit cost, circuit size, and design time.

SUMMARY

A circuit includes a first oscillator having transistors to produce a first signal with random variations resulting from device channel resistance of the transistors.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

The embodiments described herein are merely illustrative, and one skilled in the art will appreciate that numerous modifications can be made which nonetheless fall within the scope of the present invention.

Figure 1:
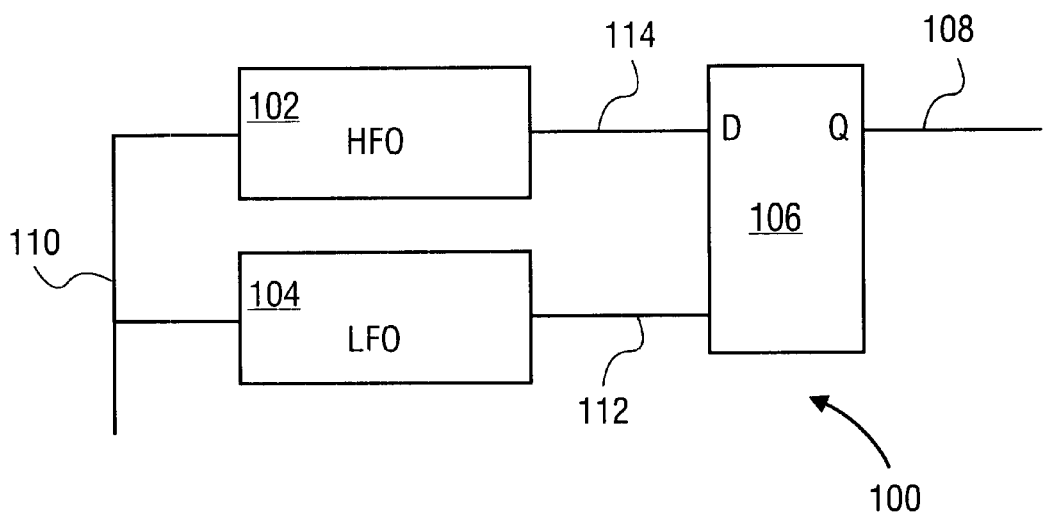
FIG. 1 shows an embodiment of a circuit in accordance with the present invention.

FIG. 1 shows an embodiment 100 of a circuit in accordance with the present invention. Embodiment 100 comprises a high frequency oscillator 102 (HFO), a low frequency oscillator 104 (LFO), and a D style flip-flop 106. A differential sampler circuit or other sampling device could be employed in place of flip-flop 106. Operation of the circuit 100 is enabled using the enable signal 110 provided to HFO 102 and LFO 104. LFO 104 outputs a low frequency signal 112 comprising truly random variations in the timing of signal edges. Signal 112 may be provided to clock input of flip-flop 106. HFO 102 provides a high frequency periodic signal 114 to the D terminal of flip-flop 106. For example, if a differential sampler is employed, HFO 102 could output two periodic signals which are 180 degrees out of phase, the signals applied to a D terminal and a D-bar terminal, respectively. Signal 114 is sampled at random points in time according to the random variations in LFO signal edge timing, to provide random bit sequence 108.

Figure 4:
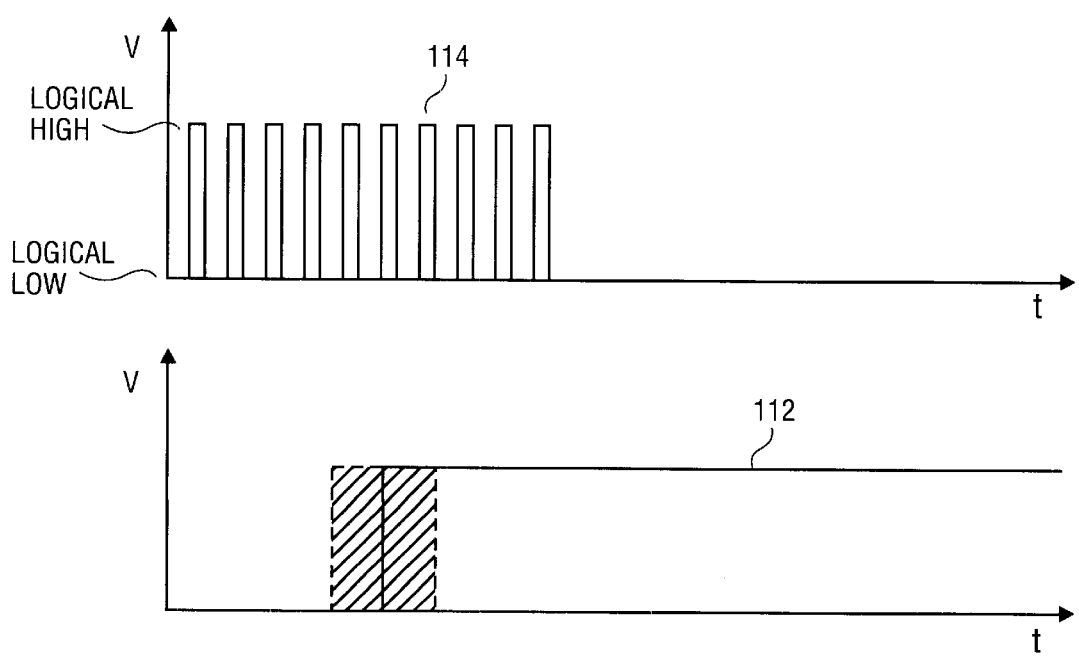
FIG. 4 shows embodiments of HFO signal and LFO signal.
Figure 5:
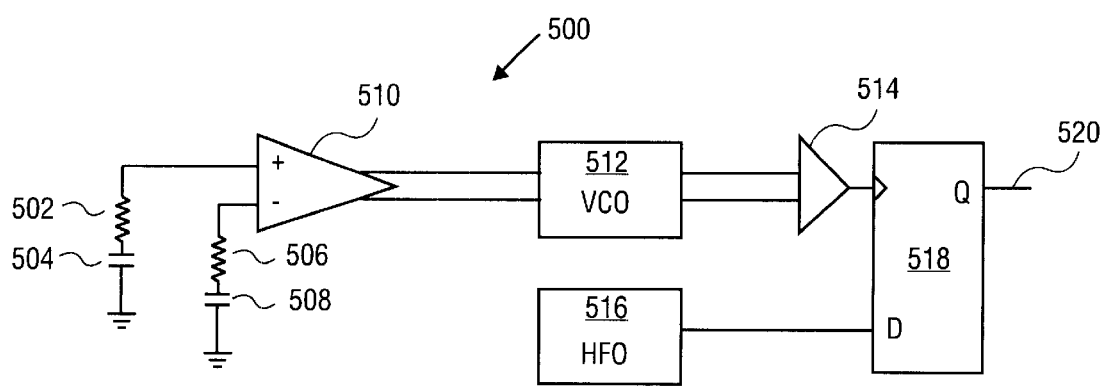
FIG. 5 shows a prior art circuit which employs thermal noise characteristics of electrical components to generate a random bit sequence.

FIG. 4 shows embodiments of HFO signal 114 and LFO signal 112. The crosshatched region of signal 112 indicates a range of time at which an edge of signal 112 can occur. The edge will occur within this range randomly. Signal 114 may be sampled at any point within the cross-hatched range, according to when the edge of signal 112 actually occurs. Signal 114 may be sampled at a logical low (producing a 0 random bit in signal 108) or at a logical high (producing a 1 bit in signal 108). Whether or not the bit of signal 108 is a 1 or a 0 depends upon the random timing of an edge of signal 112.

Figure 2:
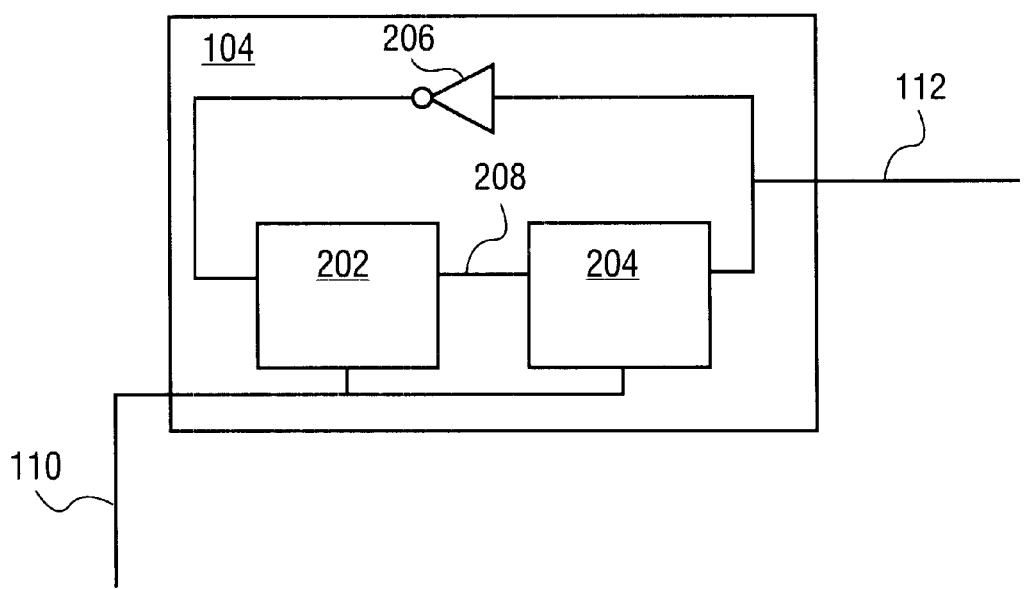
FIG. 2 shows an embodiment of LFO in accordance with the present invention.

FIG. 2 shows an embodiment of LFO 104 in accordance with the present invention. LFO 104 comprises first stage 202 and second stage 204 which, in one embodiment, are substantially similar circuits. An output signal 112 of stage 204 is fed back through inverter 206 to stage 202. Intermediate signal 208 passes between the stages. Enable signal 110 is provided to each stage. In one embodiment, enable signal 110 must be asserted in order for LFO 104 to properly produce signal 112. Signal 112 may be provided to clock input terminal of flip-flop 106. Edges of signal 112 vary in time randomly, resulting in random variations in the time when flip-flop 106 latches HFO signal 114.

The manner in which random variations are introduced into the timing of signal 112 edges is described further below. Random variations are introduced using traditional FET devices using the thermal noise inherent in FET device channel resistance. A circuit operating in this fashion is more easily implemented and scalable to newer processes where faster, leakier, and lower- voltage devices make the prior art designs more difficult to realize. According to one embodiment, the noise source (resistor-capacitor pairs, amplifier, and control circuitry utilized to equalize and operate the amplifier may be eliminated from the design.

An indication (known as the Figure of Merit or FOM) of the random quality of the LFO signal 112 may be obtained by dividing the variation in the LFO signal 112 period $T_{LFO}$ by the HFO signal 114 period $T_{HFO}$. The variation in $T_{LFO}$ may be represented as $\Delta T_{LFO}$.

In symbols, $$FOM = \Delta T_{LFO}/T_{HFO}$$

The $\Delta T_{LFO}$ may increase as more stages, such as stages 202 and 204, are added to LFO 104. The invention is in no way limited to two stages and may in fact comprise a single stage or any number of stages greater than two. Adding more stages may increase the size of LFO circuit 104 and increase $T_{LFO}$. This will in turn decrease the frequency of random bit sequence 108, because a new random bit may be generated each time a new edge of LFO signal 112 is applied to clock terminal of flip-flop 106. (Of course, some sampling circuits may be triggered by a falling edge of LFO signal 112). Therefore, $T_{LFO}$ affects the frequency of random bit sequence 108.

Figure 3:
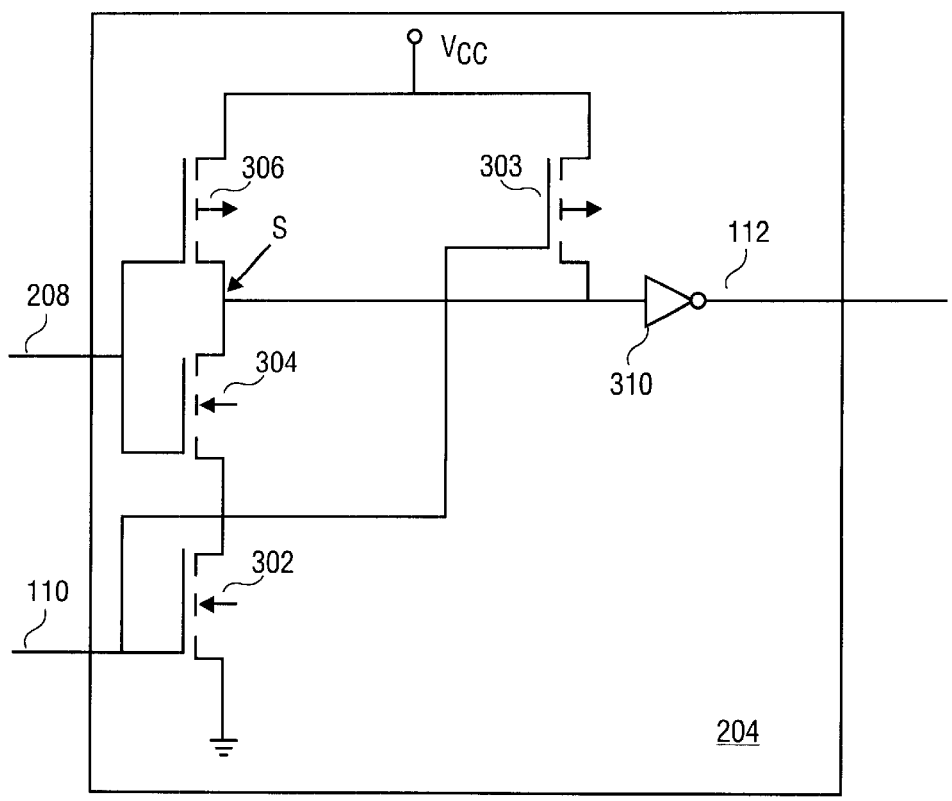
FIG. 3 shows an embodiment of one stage of LFO in accordance with the present invention.

FIG. 3 shows an embodiment of one stage 204 of LFO 104 in accordance with the present invention. Embodiment 204 comprises a first PFET (a P channel field effect transistor) 306 and a second PFET 308. Embodiment 204 further comprises a first NFET (an N channel field effect transistor) 304 and a second NFET 302. In one embodiment, when enable signal 110 is asserted the four FETs may operate to invert signal 208, providing signal 312 as an inverted form of signal 208. Inverter 310 may then invert signal 312 to produce LFO clock signal 112.

In one embodiment PFET 306 is designed with a device channel which is long relative to the width of the channel. Channel length refers to the physical separation between the diffusion regions of the FET. By making the channel long relative to its width, resistive characteristics of the FET channel are increased. Likewise, NFET 304 is designed with a device channel long relative to its width. Providing FETs 306 and 304 with longer channels relative to width increases the device channel resistance of FETs 304 and 306, which in turn increases random variations in the voltage at node S. Increasing random variations in the voltage at node S results in random $\Delta T_{LFO}$ variations, according to the equation $$\Delta T_{LFO} = (T_{LFO}/V) * \sqrt{(kT/C)}$$

Here V is the voltage as measured at node S of circuit 204. Symbol k represents the well-known Boltzmann's constant, and C is the capacitance of node S relative to ground. T is the operating temperature of circuit 204.

Utilizing long-channel FET devices increases $T_{LFO}$, thus increasing $\Delta T_{LFO}$. The equation demonstrates that $\Delta T_{LFO}$ may be further increased by decreasing the capacitance C at node S. Capacitance C may be reduced by minimizing the gate area of inverter 310. For example, gate area of inverter 310 may be reduced by designing the transistors of inverter 310 with low channel width and channel length. Increasing the length of the device channels of FETs 304 and 306 will typically not substantially increase the capacitance at node S.

As more stages such as stage 204 are added to LFO 104, the overall $\Delta T_{LFO}$ may increase according to the sum of the squares of $\Delta T_{LFO}$ for each stage. (e.g. $\Delta T_{LFO\ total} = \sqrt{(\Delta T_{LFO\ stage\ 1} + \Delta T_{LFO\ stage\ 2} + \Delta T_{LFO\ stage\ 3} \cdots)}$ Increasing $\Delta T_{LFO}$ increases FOM, e.g. increases the randomness of timing of edges of LFO signal 112.

The present invention helps eliminate the need for analog amplifiers in the generation of the truly random bit sequence 108, and thus reduces circuit size, cost, design time and complexity. This invention also provides a more scalable design for high speed, low power (low voltage) circuits. Designing amplifiers such as those utilized in prior art designs is substantially more difficult as the speed of the circuits increases and the operating voltages decrease.

Once application of the present invention may be found in processor circuits. A computer system may comprise a processor and a memory coupled to the processor by way of a bus. The memory may store instruction signals which, when executed by the processor, may result in the computer system carrying out certain operations such as reading input signals and producing output signals by way of peripheral devices. The processor may encrypt output signals or decrypt input signals from said peripheral devices. The present invention may be employed to provide truly random bit sequences within the processor circuit to supply the encryption or decryption operations.

While certain features of the invention have been illustrated as described herein, many modifications, substitutions, changes and equivalents will now occur to those skilled in the art. It is, therefore, to be understood that the appended claims are intended to cover all such embodiments and changes as fall within the true spirit of the invention.

What is claimed is:

1. A circuit comprising:

a first oscillator having transistors to produce a first signal with random variations resulting from device channel resistance of the transistors; and a second oscillator to produce a second signal, the first signal applied to sample the second signal.

2. The circuit of claim 1 further comprising:

a sampling circuit to which the first signal is applied to sample the second signal.

3. The circuit of claim 1, the first oscillator further comprising: a logic gate coupled to a node of the oscillator to which the transistors are also coupled, the logic gate having a gate area adapted to reduce the capacitance at the node.

4. A circuit comprising:

a first oscillator to produce a first signal; and a second oscillator having transistors to produce a second signal with random variations resulting from device channel resistance of the transistors, the second signal applied to sample the first signal.

5. The circuit of claim 4 further comprising:

a sampling circuit to which the second signal is applied to sample the first signal.

6. The circuit of claim 4 in which the second oscillator further comprises:

a logic gate coupled to a node of the second oscillator to which the transistors are also coupled, the logic gate having a gate area adapted to reduce the capacitance at the node.

7. The circuit of claim 4, the second oscillator further comprising:

a plurality of stages, each stage having transistors with device channel resistance which contributes to the random variations of the second signal.

8. A method comprising:

applying device channel resistance of transistors to produce random variations in a first signal; and applying the first signal to sample a second signal.

9. The method of claim 8 further comprising:

providing a logic gate coupled to the transistors, the logic gate having a gate area adapted to reduce a capacitance to which the first signal is subjected.

10. A system comprising:

a processor coupled to a memory by way of a bus, the processor comprising a first oscillator having transistors to produce a first signal with random variations resulting from device channel resistance of the transistors; and a second oscillator to produce a second signal, the first signal applied to sample the second signal.

11. The system of claim 10, the processor further comprising:

a logic gate coupled to a node of the first oscillator to which the transistors are also coupled, the logic gate having a gate area adapted to reduce the capacitance at the node.

12. A system comprising:

a processor coupled to a memory by way of a bus, the processor comprising a first oscillator to produce a first signal; and a second oscillator having transistors to produce a second signal with random variations resulting from device channel resistance of the transistors, the second signal applied to sample the first signal.

13. The system of claim 12 the processor further comprising:

a sampling circuit to which the second signal is applied to sample the first signal.

14. The system of claim 12 in which the processor further comprises:

a logic gate coupled to a node of the second oscillator to which the transistors are also coupled, the logic gate having a gate area adapted to reduce the capacitance at the node.

* * * * *